United States Patent
Kim et al.

(10) Patent No.: US 8,637,948 B2
(45) Date of Patent: Jan. 28, 2014

(54) PHOTOVOLTAIC DEVICE

(75) Inventors: Hyun-Jong Kim, Yongin-si (KR); Czang-Ho Lee, Yongin-si (KR); Min Park, Yongin-si (KR); Kyoung-Jin Seo, Yongin-si (KR); Sang-Won Lee, Yongin-si (KR); Jun-Ki Hong, Yongin-si (KR); Byoung-Gook Jeong, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 13/552,594

(22) Filed: Jul. 18, 2012

(65) Prior Publication Data
US 2013/0175648 A1 Jul. 11, 2013

Related U.S. Application Data

(60) Provisional application No. 61/585,106, filed on Jan. 10, 2012.

(51) Int. Cl.
*H01L 31/0232* (2006.01)
*H01L 21/00* (2006.01)

(52) U.S. Cl.
USPC .............. 257/432; 257/E31.001; 257/E31.11; 257/E31.119; 438/57

(58) Field of Classification Search
CPC ................... H01L 27/14643; H01L 27/14683; H01L 27/14627; H01L 27/14685; H01L 27/14621; Y02E 10/50
USPC ............ 257/431, 432, 437, E31.001, E31.11, 257/E31.119; 438/48, 57, 69, 72
See application file for complete search history.

(56) References Cited

U.S. PATENT DOCUMENTS

| 7,897,867 | B1 | 3/2011 | Mulligan et al. |
| 2010/0032012 | A1 | 2/2010 | Isaka et al. |
| 2011/0048515 | A1* | 3/2011 | Englert et al. ................ 136/255 |
| 2011/0083735 | A1 | 4/2011 | Park et al. |
| 2011/0303280 | A1* | 12/2011 | Pawlak et al. ................ 136/256 |
| 2013/0112259 | A1* | 5/2013 | Krokoszinski ................ 136/256 |

FOREIGN PATENT DOCUMENTS

KR  10-2011-0007499 A  1/2011

* cited by examiner

*Primary Examiner* — Nikolay Yushin
(74) *Attorney, Agent, or Firm* — Christie, Parker & Hale, LLP

(57) ABSTRACT

A photovoltaic device including a semiconductor substrate having a first surface and a second surface, the second surface being opposite to the first surface; a first passivation layer on the first surface; and a second passivation layer on the second surface, wherein each of the first passivation layer and the second passivation layer comprises an aluminum-based compound, is disclosed. A method of preparing a photovoltaic device, the method including: forming a semiconductor substrate to have a first surface and a second surface, the second surface being opposite to the first surface; forming an emitter region and a back surface field (BSF) region at the second surface; and forming a first passivation layer on the first surface and a second passivation layer on the second surface, wherein the first passivation layer and the second passivation layer are formed concurrently, is also disclosed.

20 Claims, 7 Drawing Sheets

PHOTOVOLTAIC DEVICE

CROSS-REFERENCE TO RELATED APPLICATION

This application claims priority to and the benefit of U.S. Provisional Application No. 61/585,106, filed on Jan. 10, 2012, in the United States Patent and Trademark Office, the entire content of which is incorporated herein by reference.

BACKGROUND

1. Field

Aspects of embodiments of the present invention relate to a photovoltaic device.

2. Description of Related Art

A solar cell is a photovoltaic device for converting light, such as sunlight, to electric energy. Unlike other energy sources, solar energy is virtually infinite and is an environmentally friendly energy source, and thus is becoming more and more important. The most basic structure of a solar cell is a diode formed of a PN junction and is categorized according to the materials that constitute the light absorbing layer.

Solar cells having light absorbing layers formed of silicon may be categorized into crystalline (for example, polycrystalline) wafer type solar cells and thin-film (amorphous, polycrystalline) type solar cells. The most popular examples of solar cells include compound thin-film solar cells using $CuInGaSe_2$ (CIGS) or CdTe, Group III-V solar cells, dye-sensitized solar cells, and organic solar cells.

In order to manufacture a photovoltaic device, a p-n junction is formed by doping an n-type (or p-type) dopant into a p-type (or n-type) substrate so as to form an emitter. Electron-hole pairs formed by receiving light are separated, and then electrons are collected by an electrode of an n-type area and holes are collected by an electrode of a p-type area, thereby generating electric power.

SUMMARY

Aspects of embodiments of the present invention are directed toward a photovoltaic device, and more particularly, to a back contact photovoltaic device.

According to an embodiment of the present invention, a photovoltaic device includes: a semiconductor substrate having a first surface and a second surface, the second surface being opposite to the first surface; a first passivation layer on the first surface; and a second passivation layer on the second surface, wherein each of the first passivation layer and the second passivation layer includes an aluminum-based compound.

The aluminum-based compound of at least one of the first passivation layer or the second passivation layer may be aluminum oxide, aluminum oxynitride, or aluminum nitride.

The aluminum-based compound of the first passivation layer and the aluminum-based compound of the second passivation layer may be the same.

At least one of the first passivation layer or the second passivation layer may have a refractive index of about 1.5 or more.

The at least one of the first passivation layer or the second passivation layer may have a refractive index in a range of about 1.5 to about 2.5.

At least one of the first passivation layer or the second passivation layer may have a thickness in a range of about 5 nm to about 50 nm.

The first surface may be textured.

The photovoltaic device may further include: an anti-reflective layer on the first passivation layer; an emitter region and a back surface field (BSF) region at the second surface; a protective layer on the second passivation layer; a first electrode electrically coupled to the emitter region at the second surface; and a second electrode electrically coupled to the BSF region at the second surface.

The anti-reflective layer may include silicon nitride, silicon oxynitride, aluminum nitride, aluminum oxide, carbon, or silicon carbide.

The anti-reflective layer may include silicon nitride, silicon oxynitride, carbon, or silicon carbide.

The emitter regions may be wider than the BSF regions.

The second passivation layer and the protective layer may have a plurality of contact holes passing through the second passivation layer and the protective layer.

At least one of the first electrode or the second electrode may include a metal selected from the group consisting of silver (Ag), gold (Au), copper (Cu), aluminum (Al) and alloys thereof.

Aspects of embodiments of the present invention are also directed toward a method of preparing a photovoltaic device, the method including: forming a semiconductor substrate to have a first surface and a second surface, the second surface being opposite to the first surface; forming an emitter region and a back surface field (BSF) region at the second surface; and forming a first passivation layer on the first surface and a second passivation layer on the second surface, wherein the first passivation layer and the second passivation layer are formed concurrently.

In an embodiment, the method further includes texturing the first surface.

In an embodiment, the method further includes: forming a protective layer on the second passivation layer; forming a first contact hole and a second contact hole in the second passivation layer and protective layer; forming a first electrode to be electrically coupled to the emitter region via the first contact hole; and forming a second electrode to be electrically coupled to the BSF region via the second contact hole.

The first passivation layer and the second passivation layer may be formed simultaneously.

The emitter region and the back surface field (BSF) region may be formed independently.

Aspects of embodiments of the present invention are also directed toward a method of preparing a photovoltaic device, the method including: forming a semiconductor substrate to have a first surface and a second surface, the second surface being opposite to the first surface; forming an emitter region and a back surface field (BSF) region at the second surface; and forming a first passivation layer on the first surface and a second passivation layer on the second surface, wherein each of the first passivation layer and the second passivation layer includes an aluminum-based compound.

The first passivation layer and the second passivation layer may be formed concurrently.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
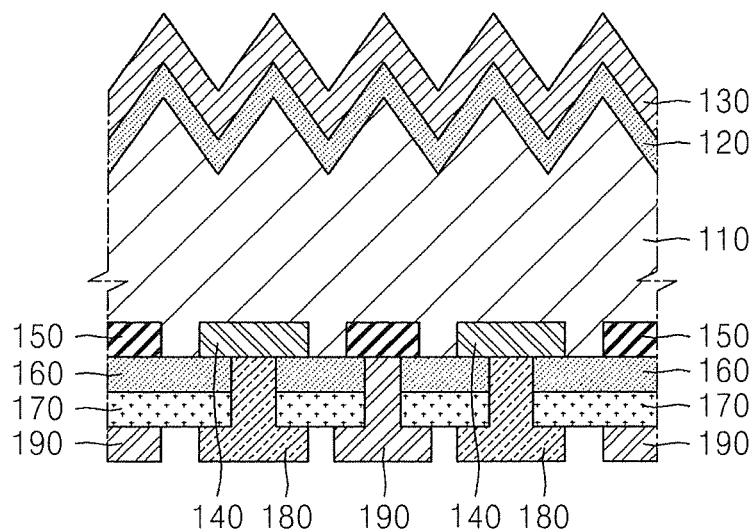
FIG. 1 is a schematic cross-sectional view of a photovoltaic device according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when a first element is referred to as being "on" a second element, it can be directly on the second element or be indirectly on the second element with one or more intervening elements interposed therebetween. Like reference numerals designate like elements throughout the specification.

FIG. 1 is a schematic cross-sectional view of a photovoltaic device according to an embodiment of the present invention.

Referring to FIG. 1, the photovoltaic device according to this embodiment is a back contact photovoltaic device and includes passivation layers that are formed as an aluminum oxide (AlOx) layer on a light receiving surface of the photovoltaic device and an aluminum oxide (AlOx) layer on a rear surface of the photovoltaic device. In more detail, the photovoltaic device according to the present embodiment includes a semiconductor 110, a first passivation layer 120 and an anti-reflective layer 130 that are formed on a first surface of the semiconductor 110, emitter regions 140 and back surface field (BSF) regions 150 that are formed on a second surface of the semiconductor 110, a second passivation layer 160, a protective layer 170, and first and second electrodes 180 and 190. The first and second passivation layers 120 and 160 may be formed concurrently on two surfaces of the photovoltaic device, for example, the first and second surfaces of the semiconductor 110 may be simultaneously formed by using a single process and may include an aluminum-based compound of the same composition. In more detail, examples of the aluminum-based compound may include an aluminum oxide (AlOx) layer, an aluminum oxynitride (AlON) layer, or an aluminum nitride (AlNx) layer. The aluminum-based compound includes a negative fixed charge, and interface properties between the aluminum-based compound and silicon are good, for example, defects between the aluminum-based compound and silicon may be minimized, thereby having an excellent passivation effect.

The semiconductor 110 may include a crystalline silicon substrate. For example, the semiconductor 110 may be a mono-crystalline substrate or a poly-crystalline substrate. The semiconductor 110 may be an n-type or p-type conductive silicon substrate.

The semiconductor 110 may have a first surface and a second surface opposite to the first surface. In an embodiment, the first surface is a light receiving surface. Both the first and second electrodes 180 and 190 may be formed on the second surface. In order to increase an optical path of incident light and improve light absorption efficiency, a texture structure including an uneven pattern may be formed on the first surface. The texture structure may be an uneven surface including a plurality of fine protrusions. The semiconductor 110 having the texture structure may increase absorption efficiency of light and may reduce reflectivity of light, thereby improving the efficiency of the photovoltaic device.

The first passivation layer 120 may be formed on the first surface of the semiconductor 110 and may passivate a surface of the semiconductor 110, thereby improving light receiving properties. For example, the first passivation layer 120 may be formed as an aluminum oxide (AlOx) layer. Alternatively, the first passivation layer 120 may be formed as an aluminum oxynitride (AlON) layer, or an aluminum nitride (AlNx) layer.

The first passivation layer 120 may have a refractive index of 1.5 or more. For example, the first passivation layer 120 may include an aluminum-based compound having a refractive index in a range of about 1.5 to about 2.5. The first passivation layer 120 may be formed to have a thickness in a range of about 5 nm to about 50 nm. In one embodiment, when the thickness of the first passivation layer 120 is less than 5 nm, passivation quality is reduced. In another embodiment, when the thickness of the first passivation layer 120 is greater than 50 nm, the optical property of the first passivation layer 120 deteriorates and a manufacturing time is increased.

A refractive index of a silicon oxide layer may be about 1.46. However, since the first passivation layer 120 according to the present embodiment has a refractive index of 1.5 or more, the first passivation layer 120 together with the anti-reflective layer 130 that will be described below may have enhanced properties for absorbing light. For example, the first passivation layer 120 may have a refractive index range from about 1.5 to about 2.5.

The anti-reflective layer 130 is formed on the first passivation layer 120 and prevents (or reduces) light absorption loss of the photovoltaic device when sunlight is incident on the photovoltaic device. The anti-reflective layer 130 may prevent the light receiving surface of the photovoltaic device from being damaged, or it may reduce such damage. The anti-reflective layer 130 may be formed of hydrogenated SiNx. Alternatively, the anti-reflective layer 130 may be formed as a dielectric layer such as a silicon nitride (SiNx) layer, a silicon oxynitride (SiON) layer, an aluminum nitride (AlN) layer, an aluminum oxide (AlOx) layer, a carbon layer, or a silicon carbide (SiC) layer. For example, the anti-reflective may include silicon nitride, silicon oxynitride, carbon, or silicon carbide.

The emitter regions 140 and the BSF regions 150 may be alternately formed on the second surface of the semiconductor 110. In one embodiment, the emitter regions 140 are formed to have a wider area than the BSF regions 150, thereby improving collecting efficiency of a carrier and improving efficiency of the photovoltaic device.

The first and second electrodes 180 and 190 may be formed of metal and may be connected to the emitter regions 140 and the BSF regions 150 through ohmic contact, respectively.

The first electrode 180 may include a plurality of first finger electrodes for collecting carriers and disposed to correspond to the emitter regions 140, and a first bus bar connected to the first finger electrodes. The first electrode 180 may include a metal selected from the group consisting of silver (Ag), gold (Au), copper (Cu), aluminum (Al) and alloys thereof.

The second electrode 190 may include a plurality of second finger electrodes for collecting carriers and disposed to correspond to the BSF regions 150, and a second bus bar connected to the second finger electrodes. The second finger electrodes may be alternately formed with the first finger electrodes. The first electrode 180 may include a metal selected from the group consisting of Ag, Au, Cu, Al, and alloys thereof.

The second passivation layer 160 may be formed on the second surface of the semiconductor 110 on which the emitter regions 140 and the BSF regions 150 are formed and may prevent (or reduce) electrical short circuits between components formed below the first and second electrodes 180 and 190 and having opposite conductive types. A plurality of contact holes may be formed in the second passivation layer 160 such that the first and second electrodes 180 and 190 may contact the emitter regions 140 and the BSF regions 150, respectively.

The second passivation layer 160 may include an aluminum-based compound. Examples of the aluminum-based compound may include an aluminum oxide (AlOx) layer, a aluminum oxynitride (AlON) layer, or an aluminum nitride (AlNx) layer. As described below, since the first passivation layer 120 and the second passivation layer 160 may be simultaneously formed using the same equipment, the thickness of the second passivation layer 160 may be substantially the same as the thickness of the first passivation layer 120. The second passivation layer 160 may be formed to have a thickness in a range of about 5 nm to about 50 nm.

Since the aluminum-based compound includes a negative fixed charge, the aluminum-based compound has an excellent passivation effect with respect to the emitter regions 140. Thus, even if the passivation effect of the second passivation layer 160 with respect to the BSF regions 150 is low, since the photovoltaic device according to the present embodiment is configured such that the size of each of the emitter regions 140 is greater than the size of the BSF regions 150 and the passivation effect of each of the emitter regions 140 is very high, the efficiency of the photovoltaic device may be excellent.

The protective layer 170 may be formed on the second passivation layer 160. The protective layer 170 may be formed as a dielectric layer such as a silicon nitride (SiNx) layer, a silicon oxynitride (SiON) layer, an aluminum nitride (AlN) layer, an aluminum oxide (AlOx) layer, a carbon layer, or a silicon carbide (SiC) layer. The protective layer 170 prevents the second passivation layer 160 from being physically and chemically damaged, or it reduces such damage.

Figure 2:
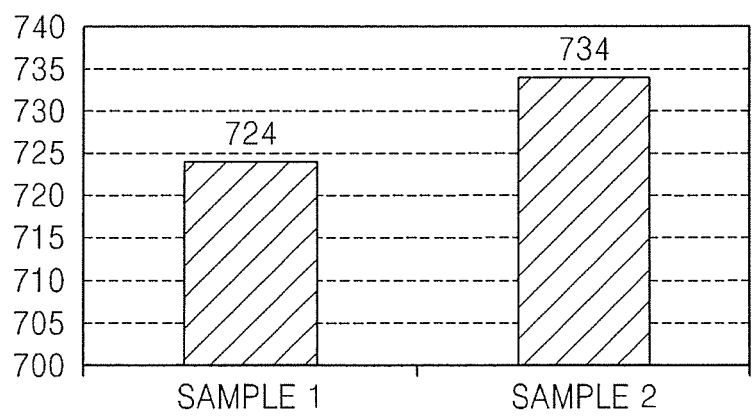
FIG. 2 is a graph showing data for estimating the properties of a photovoltaic device including a semiconductor substrate and an aluminum oxide layer according to an embodiment of the present invention and shows Implied Voc that is measured in order to obtain a relationship between the type of the semiconductor substrate and the aluminum oxide layer.
Figure 3:
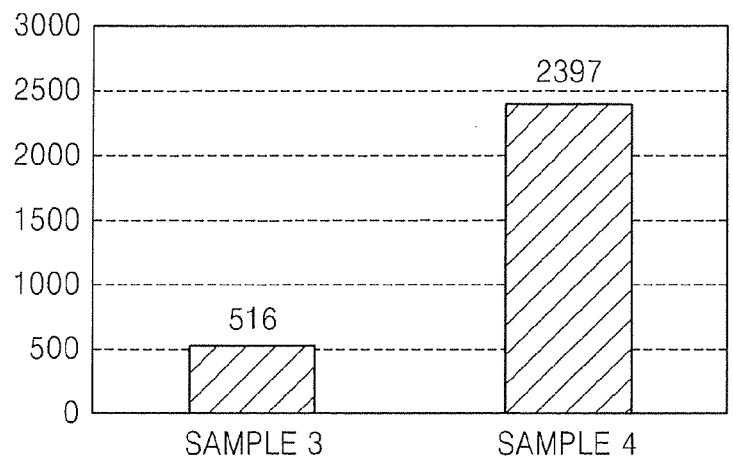
FIG. 3 is a graph showing data for estimating the properties of a photovoltaic device according to an embodiment of the present invention and shows carrier lifetimes when a diffused layer/silicon oxide layer or an aluminum oxide layer are used as a passivation layer of the light receiving side.
Figure 4:
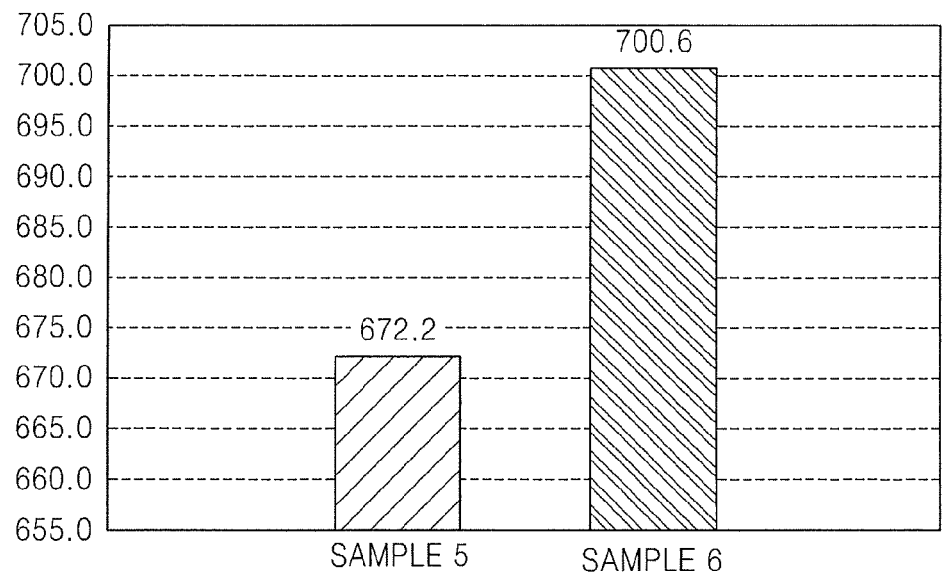
FIG. 4 is a graph showing data for estimating the properties of a passivation layer of a photovoltaic device according to an embodiment of the present invention and shows Implied Voc when a silicon oxide layer or an aluminum oxide layer are used to passivate the emitter region.

FIGS. 2 through 4 are graphs showing data for estimating the properties of a photovoltaic device, according to embodiments of the present invention.

FIG. 2 shows Implied Voc that is measured when a passivation layer is formed of an aluminum-based compound on an n-type semiconductor substrate and a p-type semiconductor substrate. The Implied Voc is evaluated by using Quasi-steady-state Photoconductance available from DBA Sinton Instruments and is related to an open circuit voltage when the first and second electrodes are not formed. The passivation properties using the Implied Voc are measured with respect to samples 1 and 2 according to the following description. Sample 1 was prepared by forming an aluminum oxide layer on both surfaces of a p-type silicon substrate. Sample 2 was prepared by forming an aluminum oxide layer on two surfaces of an n-type silicon substrate.

In general, when Imp-Voc is equal to or greater than about 700 mV, it may be concluded that the photovoltaic device tested has good quality. Referring to FIG. 2, both the aluminum oxide layers of samples 1 and 2 have excellent passivation qualities. Comparing samples 1 and 2, an aluminum oxide passivation layer may be applied to both n-type and p-type semiconductor substrates and provide good results.

FIG. 3 is a graph for evaluating carrier lifetimes of a sample 3 (e.g., a comparative example), which includes a POCl$_3$ diffused layer and a silicon oxide layer as a passivation layer and a sample 4 (e.g., an additional example) using an aluminum-based compound layer as a passivation layer.

In order to evaluate the lifetimes, sample 3 was prepared by sequentially forming a POCl$_3$ diffused layer, a silicon oxide layer, and a silicon nitride layer on both textured surfaces of a substrate. Sample 4 was prepared by sequentially forming an aluminum oxide layer and a silicon nitride layer on both surfaces of a substrate that was substantially the same as the substrate used to prepare sample 3. In the evaluation, in order to ensure result reliability, adjacent silicon wafers in the same ingot were used as a semiconductor substrate so as to have the most similar bulk properties possible.

Referring to FIG. 3, with regard to sample 3, carrier lifetime was about 516 μsec. With regard to sample 4 according to an embodiment of the present invention, carrier lifetime was about 2397 μsec, which is about 4.6 times longer than that in sample 3.

When a single silicon oxide layer is formed as a passivation layer, since the quality of the passivation layer is low, a diffused layer or a hydrogenated SiNx layer is needed to compensate for the insufficient passivation function of the silicon oxide layer, like in sample 3.

However, sample 4 according to an embodiment of the present invention, in which a single layer of aluminum oxide is formed as a passivation layer, has excellent passivation quality as compared to sample 3, which uses a POCl$_3$ diffused layer and a silicon oxide layer as the passivation layer. In addition, in the embodiment of the present invention exemplified by sample 4, a separate diffused layer does not have to be formed. Thus, according to embodiments of the present invention, a separate process for forming the separate diffused layer does not have to be performed and light loss due to use of a diffused layer may be prevented (or reduced).

FIG. 4 shows Imp-Voc of sample 5 (e.g., a comparative example), which includes a silicon oxide layer as a passivation layer, and sample 6 (e.g., an additional example), which includes an aluminum-based compound layer as a passivation layer. Sample 5 was prepared by forming emitter regions on both surfaces of a silicon substrate and then forming silicon oxide layers on the emitter regions. Sample 6 was prepared by forming emitter regions on both surfaces of a silicon substrate from the same ingot as in sample 5 and then forming aluminum oxide layers on the emitter regions.

Referring to FIG. 4, it may be concluded that Imp-Voc of sample 5 is about 672.2 mV and Imp-Voc of sample 6 is about 700.6 mV. Comparing samples 5 and 6, an embodiment of the present invention that includes an aluminum oxide layer as a passivation layer of an emitter region (e.g., sample 6) has excellent passivation quality as compared to a comparative example that includes silicon oxide passivation layers (e.g., sample 5). According to embodiments of the present invention, the aluminum-based compound includes a negative fixed charge, thereby having an excellent passivation effect.

With regard to a back contact photovoltaic device, since an emitter region and a BSF region are formed on the same surface, a silicon oxide layer may be used to concurrently or simultaneously passivate the emitter region and the BSF region. However, when the emitter region is formed to have a wider area than the BSF region such that the collecting efficiency of a carrier is improved and a back contact photovoltaic device has high efficiency, passivation of the emitter region is more important than passivation of the BSF region, like in some embodiments of the present invention.

Thus, in one embodiment, when an aluminum oxide layer is used as a passivation layer on the BSF region has the same or reduced passivation effect than a case where a silicon oxide passivation layer is used, the efficiency of the photovoltaic device is barely affected. However, like in sample 6, since a passivation layer formed as an aluminum oxide layer has an excellent effect compared to a passivation layer formed as a silicon oxide layer on the emitter region and the emitter region has a wider area than the BSF region, when an aluminum oxide layer is used as a passivation layer, the efficiency of the photovoltaic device is excellent, as compared to a photovoltaic device including a silicon oxide layer as a passivation layer.

Thus far, the case where the first and second passivation layers 120 and 160 are each formed as an aluminum oxide layer has been described. However, the first and second passivation layers 120 and 160 may include an aluminum oxynitride (AlON) layer or an aluminum nitride (AlNx) layer, which has a negative fixed charge.

Hereinafter a method of manufacturing a photovoltaic device will be described with reference to FIGS. 5 through 12.

Figure 5:
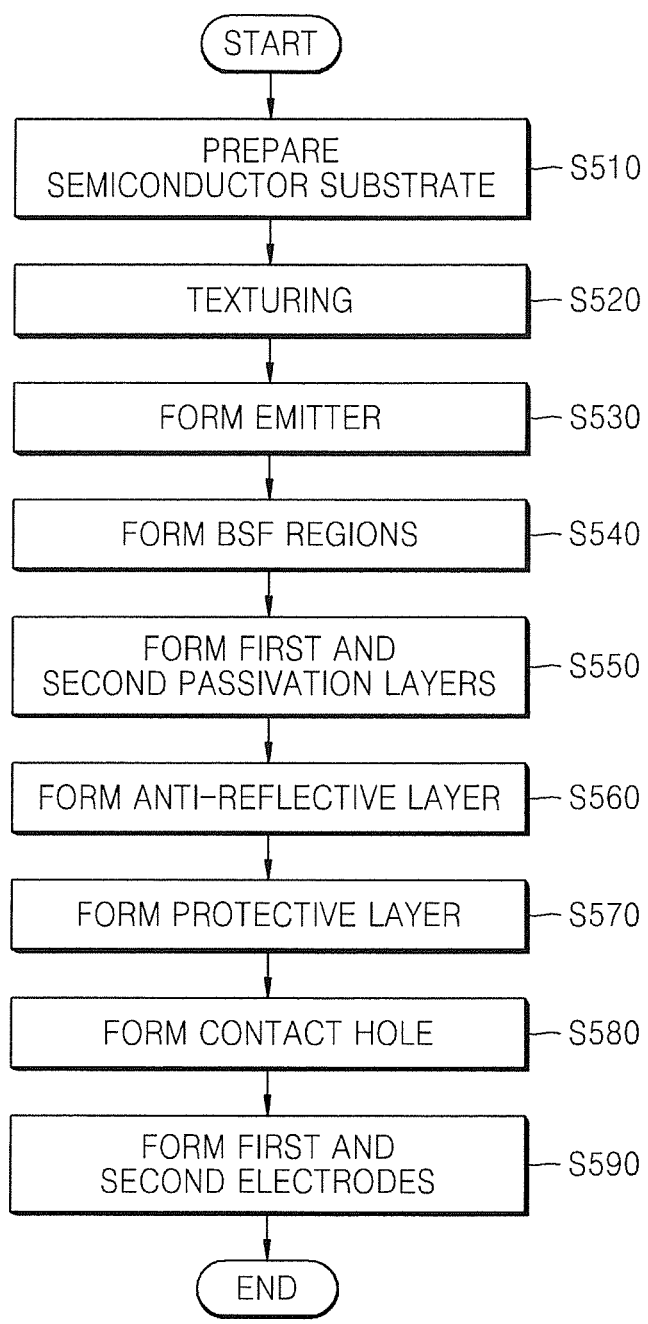
FIG. 5 is a flowchart of a method of manufacturing a photovoltaic device, according to an embodiment of the present invention.

FIG. 5 is a flowchart of a method of manufacturing a photovoltaic device, according to an embodiment of the present invention. FIGS. 6 through 13 are cross-sectional views showing operations of FIG. 5, respectively, according to an embodiment of the present invention.

Figure 6:
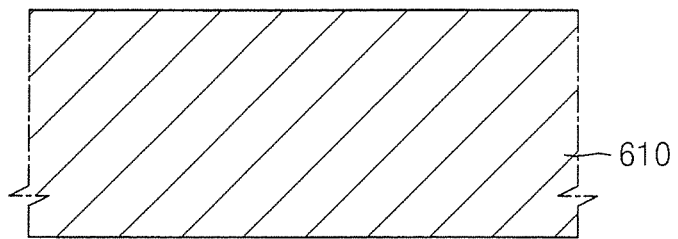
FIGS. 6 through 13 are schematic cross-sectional views showing operation of FIG. 5, according to an embodiment of the present invention.

In operation S510, a semiconductor substrate 610 is prepared (refer to FIG. 6). The semiconductor substrate 610 may include a crystalline silicon substrate. For example, the semiconductor substrate 610 may be a mono-crystalline substrate or a poly-crystalline substrate. The semiconductor substrate 610 may be an n-type or p-type conductive silicon substrate. However, as described with reference to FIG. 2, an n-type substrate may be more advantageous.

In order to remove physical and chemical impurities attached to a surface of the semiconductor substrate 610, a washing process for applying an acid solution or an alkaline solution to the semiconductor substrate 610 may be used.

In operation S520, a texture structure may be formed on a first surface of the semiconductor substrate 610. First, an anti-etching layer may be formed on the semiconductor substrate 610, except for the first surface of the semiconductor substrate 610. Then, the texture structure may be formed by etching the first surface of the semiconductor substrate 610 by using the anti-etching layer as a mask. An uneven pattern formed by texturing may increase light absorption and may reduce reflectivity, thereby improving the efficiency of the photovoltaic device. An etchant used for etching may be, for example, a mixture of KOH, iso-propyl alcohol (IPA), and N-methylpyrrolidone (NMP).

Figure 7:
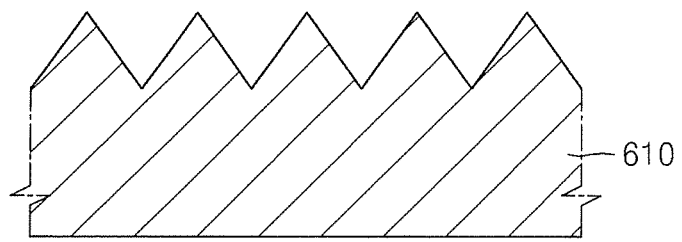

The uneven pattern is formed by etching the first surface of the semiconductor substrate 610 and then the anti-etching layer is removed, thereby obtaining a structure as shown in FIG. 7.

In operation S530, emitter regions 640 are formed. The emitter regions 640 may be spaced apart by a predetermined (or preset) interval on a second surface of the semiconductor substrate 610. For example, the emitter regions 640 may be formed by using a thermal diffusion method or an ion-implantation method. The emitter regions 640 may be formed as a p+ layer having a high concentration of a p-type dopant on the second surface of the n-type semiconductor substrate 610.

In operation S540, BSF regions 650 are formed. The BSF regions 650 may be spaced apart by a predetermined (or preset) interval on the second surface of the semiconductor substrate 610. In this case, the BSF regions 650 and the emitter regions 640 may be alternately disposed, and the BSF regions 650 may be formed to each have a smaller area than each of the emitter regions 640. The BSF regions 650 may be formed by using a thermal diffusion method or an ion-implantation method. The BSF regions 650 may be formed as an n+ layer having a high concentration of an n-type dopant on the second surface of the n-type semiconductor substrate 610.

Figure 8:
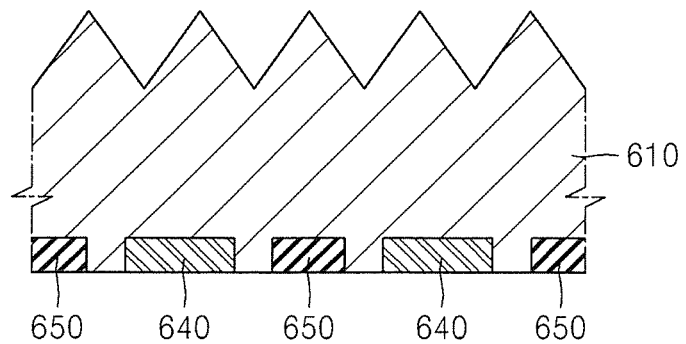

According to the present embodiment, after the emitter regions 640 are formed (S530), the BSF regions 650 are formed (S540). However, the present invention is not limited to this case. Alternatively, after the BSF regions 650 are formed, the emitter regions 640 may be formed. The emitter regions 640 and the BSF regions 650 formed in operations S530 and S540 are shown in FIG. 8. In order to obtain high efficiency of the photovoltaic device, the emitter regions 640 may be formed to have as wide an area as possible, as described above.

Figure 9:
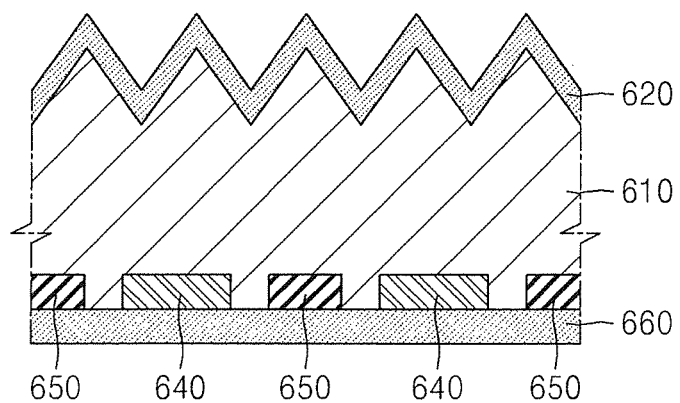

In operation S550, first and second passivation layers 620 and 660 are formed. As shown in FIG. 9, the first passivation layer 620 may be formed on a first surface of the semiconductor substrate 610 and the second passivation layer 660 may be formed on a second surface of the semiconductor substrate 610. The first and second passivation layers 620 and 660 may each be formed as an aluminum oxide layer. Alternatively, the first and second passivation layers 620 and 660 may each be formed as an aluminum oxynitride layer or an aluminum nitride layer. In one embodiment, the first passivation layer 620 may be formed to have a refractive index of about 1.5 or more. For example, the first passivation layer 620 may be formed to have a refractive index in a range of about 1.5 to about 2.5.

The first passivation layer 620 and the second passivation layer 660 that are each formed as an aluminum oxide layer may be concurrently or simultaneously formed by using a single process, for example, atomic layer deposition (ALD), plasma enhanced chemical vapor deposition (PECVD), or sputtering.

Since the first passivation layer 620 and the second passivation layer 660 are formed by using the same method, the thickness and composition of the first passivation layer 620 may be substantially the same as those of the second passivation layer 660. The thicknesses of the first passivation layer 620 and the second passivation layer 660 may be in a range of about 5 nm to about 50 nm.

Figure 10:
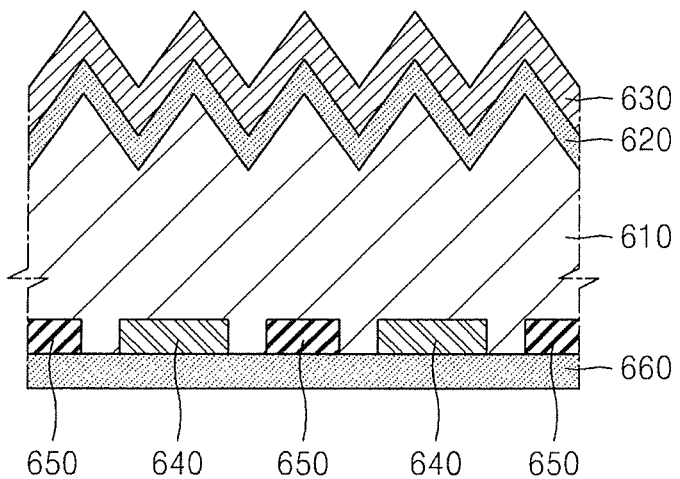

In operation S560, an anti-reflective layer 630 is formed. As shown in FIG. 10, the anti-reflective layer 630 may be formed on the first passivation layer 620 on which a light receiving surface is formed. The anti-reflective layer 630 may be formed of a hydrogenated silicon nitride layer. Alternatively, the anti-reflective layer 630 may be formed as a dielectric layer such as a silicon nitride (SiNx) layer, a silicon oxynitride (SiON) layer, an aluminum nitride (AlN) layer, an aluminum oxide (AlOx) layer, a carbon layer, or a silicon carbide (SiC) layer.

The anti-reflective layer 630 may be formed to be thicker than the first passivation layer 620 and the thickness of the anti-reflective layer 630 may be varied to have improved reflectivity. The anti-reflective layer 630 may prevent sunlight from being reflected off the photovoltaic device, or it may reduce such reflection, when sunlight is incident on the photovoltaic device, thereby preventing (or reducing) a light absorption loss of the photovoltaic device, may protect the first passivation layer 620, and may prevent a light receiving surface from being damaged (or it may reduce such damage) when a contact hole is formed in operation S570.

Figure 11:
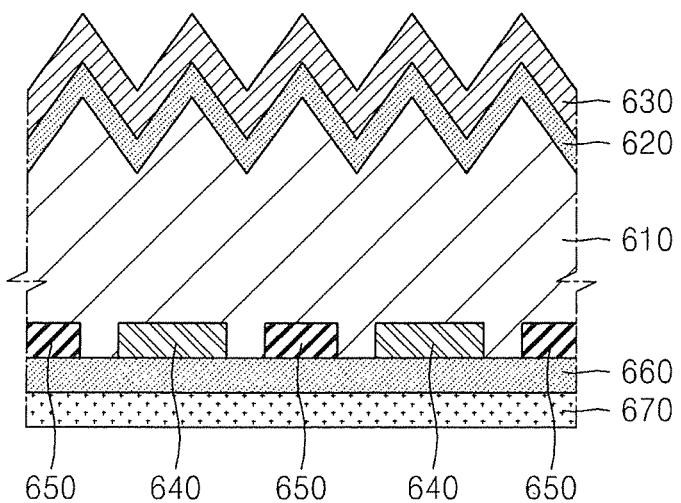

In operation S570, a protective layer 670 may be formed, as shown in FIG. 11. The protective layer 670 may be formed as a silicon nitride layer. The protective layer 670 may be formed as a dielectric layer such as a silicon nitride (SiNx) layer, a silicon oxynitride (SiON) layer, an aluminum nitride (AlN) layer, an aluminum oxide (AlOx) layer, a carbon layer, or a silicon carbide (SiC) layer.

The protective layer 670 may prevent the second passivation layer 660 from being physically damaged, it may reduce such damage. In a subsequent process for forming contact holes H and a washing process, the protective layer 670 may prevent the second passivation layer 660 from being chemically damaged, or it may reduce such damage.

In operation S580, the contact holes H are formed in the second passivation layer 660 and the protective layer 670. For example, an anti-etching layer is formed on the protective layer 670. In this case, a plurality of regions of the anti-etching layer, which correspond to the contact holes H, are opened. Then, the contact holes H may be formed by removing the portions of the protective layer 670 and the second passivation layer 660 that are not protected by the anti-etching layer.

Figure 12:
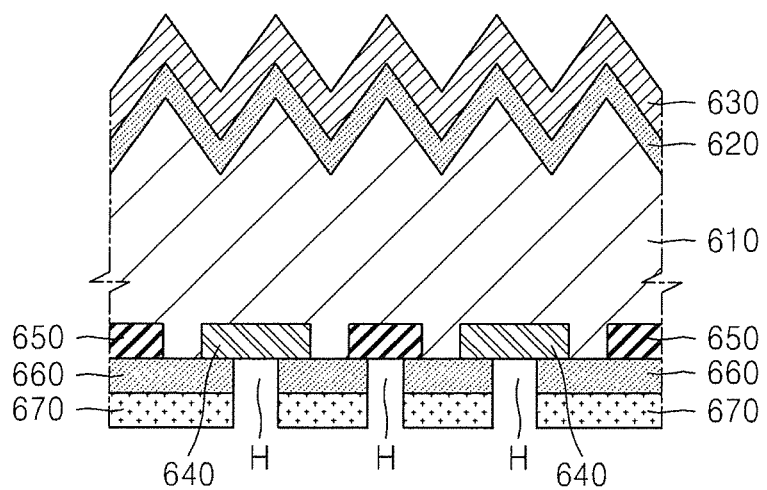

By forming the contact holes H and then removing the anti-etching layer, the portions of the emitter regions 640 and the BSF regions 650 may be exposed through the contact holes H, as shown in FIG. 12. Some of the contact holes H are used to electrically connect the emitter regions 640 and a first electrode 680 to each other and the other remaining contact holes H may be used to electrically connect the BSF regions 650 and a second electrode 690 to each other.

After the contact holes H are formed, a washing process of applying an acid solution or an alkaline solution may be performed in order to remove physical and chemical impurities attached onto the surface.

Figure 13:
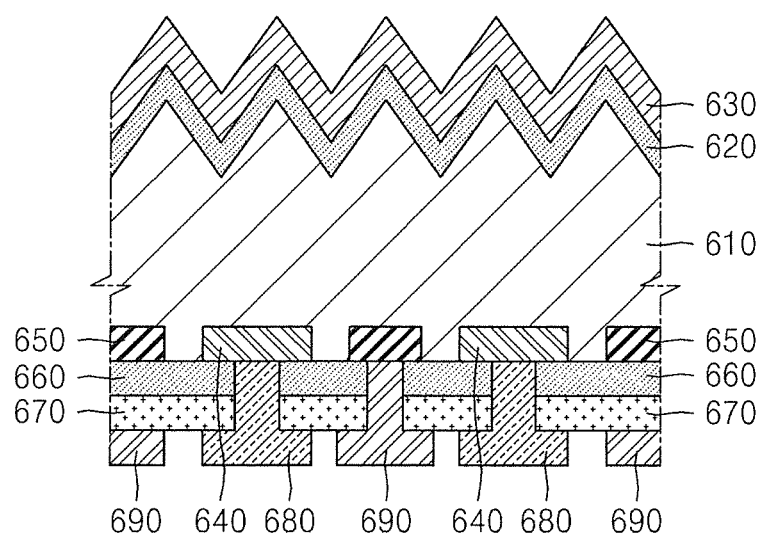

In operation S590, the first and second electrodes 680 and 690 are formed. As shown in FIG. 13, the first electrode 680 may contact the emitter regions 640 through some of the contact holes H to collect carriers. The second electrode 690 may contact the BSF regions 650 through the remaining contact holes H to collect carriers.

The first and second electrodes 680 and 690 may be formed by pattern-printing a conductive paste including a metal selected from the group consisting of Ag, Au, Cu, Al, Ni and alloys thereof by using screen printing and then firing the conductive paste. Alternatively, the first and second electrodes 680 and 690 may be formed by forming a seed layer that contacts portions of the emitter regions 640 and the BSF regions 650 through the contact holes H and then further plating metal on the seed layer.

Since the photovoltaic device according to the present embodiment includes the first and second passivation layers 120 and 160 (or 620 and 660) formed of an aluminum-based compound having two surfaces with negative fixed charges, the efficiency of the photovoltaic device may be improved, as described with reference to FIGS. 2 through 4. In addition, the first and second passivation layers 120 and 160 (or 620 and 660) may be concurrently or simultaneously formed by using a single process, thereby reducing manufacturing cost and time.

When a silicon oxide layer is used for passivation, a separate diffused layer needs to be formed in order to increase passivation efficiency, like in the case of sample 3. For example, a passivation layer including a diffused layer and a silicon oxide layer may be formed on a light receiving surface, and a passivation layer of a silicon oxide layer may be formed on an opposite surface of the light receiving surface. In this case, the passivation layer of the light receiving surface and the passivation layer of the opposite surface of the light receiving surface are formed as follows.

First, BSF regions and emitter regions may be formed on a rear surface of a semiconductor substrate and then a passivation layer of a silicon oxide layer may be formed on the rear surface. Then, a texture structure may be formed on a front surface of the semiconductor substrate by using the silicon oxide layer formed on the rear surface as a mask.

Then, a diffused layer may be formed on a light receiving surface of the semiconductor substrate 610 by using POCl$_3$ (first operation), byproducts that are kinds of glass such as phosphosilicate glass (PSG) formed during a diffusion process may be removed (second operation), and a silicon oxide layer may be formed by using deposition (third operation). In order to form a passivation layer on a light receiving surface, the above-described three operations need to be performed.

On the other hand, as described with reference to FIGS. 3 and 4, even thought the first and second passivation layers may each be formed as a single layer formed of an aluminum-based compound such as aluminum oxide, the photovoltaic device according to embodiments of the present invention have excellent passivation effects. This is because the first and second passivation layers formed of an aluminum-based compound have negative fixed charges and defects between a semiconductor substrate and/or an emitter region and a BSF region are reduced or minimized.

In addition, in the first and second passivation layers of the photovoltaic device according to embodiments of the present invention, optical loss due to a diffused layer may not occur. As described with reference to FIG. 9, since the first and second passivation layers in one embodiment are concurrently or simultaneously formed, the number of processes are reduced.

While the present invention has been described in connection with certain exemplary embodiments, it is to be understood that the invention is not limited to the disclosed embodiments, but, on the contrary is intended to cover various modifications and equivalent arrangements included within the spirit and scope of the appended claims, and equivalents thereof.

EXPLANATION OF REFERENCE NUMERALS DESIGNATING THE MAJOR ELEMENTS OF THE DRAWINGS

110, 610: semiconductor substrate
120, 620: first passivation layer
130, 630: anti-reflective layer
140, 640: emitter region
150, 650: BSF region
160, 660: second passivation layer
170, 670: protective layer
180, 680: first electrode
190, 690: second electrode

What is claimed is:
1. A photovoltaic device comprising:
a semiconductor substrate having a first surface and a second surface, the second surface being opposite to the first surface;
a first passivation layer directly contacting the first surface; and a second passivation layer directly contacting the second surface, wherein each of the first passivation layer and the second passivation layer comprises an aluminum-based compound.

2. The photovoltaic device of claim 1, wherein the aluminum-based compound of at least one of the first passivation layer or the second passivation layer is aluminum oxide, aluminum oxynitride, or aluminum nitride.

3. The photovoltaic device of claim 1, wherein the aluminum-based compound of the first passivation layer and the aluminum-based compound of the second passivation layer are the same.

4. The photovoltaic device of claim 1, wherein at least one of the first passivation layer or the second passivation layer has a refractive index of about 1.5 or more.

5. The photovoltaic device of claim 4, wherein the at least one of the first passivation layer or the second passivation layer has a refractive index in a range of about 1.5 to about 2.5.

6. The photovoltaic device of claim 1, wherein at least one of the first passivation layer or the second passivation layer has a thickness in a range of about 5 nm to about 50 nm.

7. The photovoltaic device of claim 1, wherein the first surface is textured.

8. The photovoltaic device of claim 1, further comprising:
an anti-reflective layer on the first passivation layer;
an emitter region and a back surface field (BSF) region at the second surface;
a protective layer on the second passivation layer;
a first electrode electrically coupled to the emitter region at the second surface; and
a second electrode electrically coupled to the BSF region at the second surface.

9. The photovoltaic device of claim 8, wherein the anti-reflective layer comprises silicon nitride, silicon oxynitride, aluminum nitride, aluminum oxide, carbon, or silicon carbide.

10. The photovoltaic device of claim 8, wherein the anti-reflective layer comprises silicon nitride, silicon oxynitride, carbon, or silicon carbide.

11. The photovoltaic device of claim 8, wherein the emitter regions are wider than the BSF regions.

12. The photovoltaic device of claim 8, wherein the second passivation layer and the protective layer have a plurality of contact holes passing through the second passivation layer and the protective layer.

13. The photovoltaic device of claim 8, wherein at least one of the first electrode or the second electrode comprises a metal selected from the group consisting of silver (Ag), gold (Au), copper (Cu), aluminum (Al) and alloys thereof.

14. A method of preparing a photovoltaic device, the method comprising:
forming a semiconductor substrate to have a first surface and a second surface, the second surface being opposite to the first surface;
forming an emitter region and a back surface field (BSF) region at the second surface; and
forming a first passivation layer on the first surface and a second passivation layer on the second surface, the first passivation layer directly contacting the first surface and the second passivation layer directly contacting the second surface,
wherein the first passivation layer and the second passivation layer are formed concurrently.

15. The method of claim 14, further comprising texturing the first surface.

16. The method of claim 14, further comprising:
forming a protective layer on the second passivation layer;
forming a first contact hole and a second contact hole in the second passivation layer and protective layer;
forming a first electrode to be electrically coupled to the emitter region via the first contact hole; and
forming a second electrode to be electrically coupled to the BSF region via the second contact hole.

17. The method of claim 14, wherein the first passivation layer and the second passivation layer are formed simultaneously.

18. The method of claim 14, wherein emitter region and the back surface field (BSF) region are formed independently.

19. A method of preparing a photovoltaic device, the method comprising:
forming a semiconductor substrate to have a first surface and a second surface, the second surface being opposite to the first surface;
forming an emitter region and a back surface field (BSF) region at the second surface; and
forming a first passivation layer on the first surface and a second passivation layer on the second surface, the first passivation layer directly contacting the first surface and the second passivation layer directly contacting the second surface,
wherein each of the first passivation layer and the second passivation layer comprises an aluminum-based compound.

20. The method of claim 19, wherein the first passivation layer and the second passivation layer are formed concurrently.

* * * * *

UNITED STATES PATENT AND TRADEMARK OFFICE
CERTIFICATE OF CORRECTION

PATENT NO.        : 8,637,948 B2                                     Page 1 of 1
APPLICATION NO.   : 13/552594
DATED             : January 28, 2014
INVENTOR(S)       : Hyun-Jong Kim et al.

It is certified that error appears in the above-identified patent and that said Letters Patent is hereby corrected as shown below:

In the Claims

Column 12, line 28, Claim 18        After "wherein"

Insert -- the --

Signed and Sealed this
Ninth Day of February, 2016

Michelle K. Lee
*Director of the United States Patent and Trademark Office*